US005600275A

United States Patent [19]
Garavan

[11] Patent Number: 5,600,275
[45] Date of Patent: Feb. 4, 1997

[54] LOW-VOLTAGE CMOS COMPARATOR WITH OFFSET CANCELLATION

[75] Inventor: Patrick J. Garavan, Limerick, Ireland

[73] Assignee: Analog Devices, Inc., Norwood, Mass.

[21] Appl. No.: 235,557

[22] Filed: Apr. 29, 1994

[51] Int. Cl.$^6$ ............................................. H03L 5/00
[52] U.S. Cl. .............................. 327/307; 327/63; 327/362
[58] Field of Search ..................................... 327/337, 554, 327/91, 93, 94, 96, 307, 560–563, 63, 65, 66, 89, 77, 362; 330/9, 51

[56] References Cited

U.S. PATENT DOCUMENTS

| | | | |
|---|---|---|---|
| 3,836,906 | 9/1974 | Ando et al. | 340/347 AD |
| 3,988,689 | 10/1976 | Ochi et al. | 330/51 |
| 4,028,694 | 7/1977 | Cook et al. | 340/347 AD |

(List continued on next page.)

FOREIGN PATENT DOCUMENTS

| | | |
|---|---|---|
| 0064147 | 11/1982 | European Pat. Off. . |
| 0360914 | 4/1990 | European Pat. Off. . |
| 2174288 | 10/1973 | France . |
| 2314617 | 1/1977 | France . |
| 2351544 | 12/1977 | France . |
| 2386939 | 11/1978 | France . |
| 2447119 | 8/1980 | France . |
| 2727634 | 12/1977 | Germany . |
| 2814754A1 | 10/1978 | Germany . |
| 3003099 | 7/1980 | Germany . |
| 3013333 | 10/1980 | Germany . |
| 51-150987 | 12/1976 | Japan . |
| 52-120749 | 10/1977 | Japan . |
| 52-166552 | 11/1977 | Japan . |
| 53-42438 | 10/1979 | Japan . |
| 55-20025 | 2/1980 | Japan . |
| 55-55622 | 4/1980 | Japan . |
| 55-165027 | 12/1980 | Japan . |
| 56-25826 | 3/1981 | Japan . |
| 59-35527 | 8/1984 | Japan . |
| 54-27763 | 3/1989 | Japan . |
| 919076 | 4/1982 | U.S.S.R. . |
| 1402698 | 8/1975 | United Kingdom . |
| 1518558 | 7/1978 | United Kingdom . |
| 2008350 | 5/1979 | United Kingdom . |
| WO82/00390 | 2/1982 | WIPO . |

OTHER PUBLICATIONS

Agazzi, O. et al., "An Analog Front End for Full–Duplex Transceivers Working on Twisted Pairs", IEEE J. Solid–State Circuits, vol. 24, No. 2, Apr. 1989, pp. 229–240.

Akazawa, Y. et al., "New Linearity Error Correction Technology for A/D and D/A Converter LSI", Japanese Journal of Applied Physics, vol. 22, (1983) Supplement 22-1, pp. 115–119.

Allstot, D. J. et al., "An Electrically–Programmable Switched Capacitor Filter, " IEEE J. Solid–State Circuits, vol. SC–14, No. 6, Dec. 1979, pp. 1034–1041.

Allstot, D. J., "A Precision Variable–Supply CMOS Comparator," IEEE Journal Solid–State Circuits, vol. SC–17, No. 6, pp. 1080–1087, Dec. 1982.

Analog Devices, Preliminary Technical Data, product #AD7882, Sep. 1993, pp. 1–12.

(List continued on next page.)

*Primary Examiner*—Toan Tran
*Attorney, Agent, or Firm*—Wolf, Greenfield & Sacks, P.C.

[57] ABSTRACT

A CMOS comparator which includes a capacitor connected in an electrical path between two amplification stages. The comparator also includes a voltage source, and a switch is provided between the voltage source and the input of the second stage. A variability of electrical parameter of the voltage source can be matched with a parameter of the amplification stage. The comparator can also include another switch between another voltage source and a third stage, with the two voltage sources providing different voltages. A comparator gain stage includes circuitry for deriving a differential current from the two voltages. Circuitry is also provided for loading the differential current to derive an amplified difference voltage. Further circuitry is provided for bypassing the loading circuitry to reduce a quiescent voltage drop associated with the loading circuitry.

54 Claims, 5 Drawing Sheets

U.S. PATENT DOCUMENTS

| | | | |
|---|---|---|---|
| 4,077,035 | 2/1978 | Yee | 340/347 AD |
| 4,129,863 | 12/1978 | Gray et al. | 340/347 AD |
| 4,143,361 | 3/1979 | Tammes et al. | 340/347 AD |
| 4,144,527 | 3/1979 | Butler et al. | 341/347 AD |
| 4,180,807 | 12/1979 | Eichelberger et al. | 340/347 AD |
| 4,190,854 | 2/1980 | Redfern | 357/51 |
| 4,191,900 | 3/1980 | Redfern | 307/355 |
| 4,222,107 | 9/1980 | Mrozowski et al. | 364/571 |
| 4,250,494 | 2/1991 | Butler et al. | 340/347 AD |
| 4,272,760 | 6/1981 | Prazak et al. | 340/347 CC |
| 4,295,089 | 10/1981 | Cooperman | 323/351 |
| 4,340,882 | 7/1982 | Maio et al. | 340/347 AD |
| 4,348,658 | 9/1982 | Carter | 340/347 AD |
| 4,399,426 | 8/1983 | Tan | 340/347 AD |
| 4,429,282 | 1/1984 | Saari | 330/9 |
| 4,439,693 | 3/1984 | Lucas et al. | 330/9 |
| 4,458,237 | 7/1984 | Domogalla | 340/347 AD |
| 4,517,549 | 5/1985 | Tsukakoshi | 340/347 AD |
| 4,542,354 | 9/1985 | Robinton et al. | 332/11 D |
| 4,553,052 | 11/1985 | Takahashi | 307/494 |
| 4,555,668 | 11/1985 | Gregorian et al. | 330/9 |
| 4,563,654 | 1/1986 | Arai et al. | 330/277 |
| 4,577,228 | 3/1986 | Arai et al. | 358/167 |
| 4,620,179 | 10/1986 | Cooper et al. | 340/347 AD |
| 4,654,815 | 3/1987 | Marin et al. | 364/606 |
| 4,677,422 | 6/1987 | Naito | 340/347 SH |
| 4,700,174 | 10/1987 | Sutherland et al. | 340/347 CC |
| 4,709,225 | 11/1987 | Welland et al. | 340/347 CC |
| 4,777,451 | 10/1988 | Tohyama | 330/253 |
| 4,803,462 | 2/1989 | Hester et al. | 341/172 |
| 4,804,960 | 2/1989 | Fernandes et al. | 341/172 |
| 4,812,187 | 3/1989 | Bernard | 330/253 |
| 4,829,266 | 5/1989 | Pernici et al. | 330/253 |
| 4,831,381 | 5/1989 | Hester | 330/9 |
| 4,833,418 | 5/1989 | Quintus et al. | 330/9 |
| 4,881,044 | 11/1989 | Kinoshita et al. | 330/253 |
| 4,883,987 | 11/1989 | Fattaruso | 307/355 |
| 4,907,002 | 3/1990 | Kawada | 314/172 |
| 4,982,194 | 1/1991 | Bacrania et al. | 341/172 |
| 5,016,014 | 5/1991 | Bitting | 341/162 |
| 5,036,322 | 7/1991 | Barrow et al. | 341/144 |
| 5,043,732 | 8/1991 | Robertson et al. | 341/156 |
| 5,047,665 | 9/1991 | Burt | 307/355 |
| 5,077,489 | 12/1991 | Gola et al. | 307/362 |
| 5,124,663 | 6/1992 | McEntarfer et al. | 330/9 |
| 5,138,319 | 8/1992 | Tesch | 341/156 |
| 5,184,130 | 2/1993 | Mangelsdorf | 341/156 |
| 5,220,206 | 6/1993 | Tsang et al. | 307/296.3 |
| 5,233,180 | 8/1993 | Tsuruta et al. | 250/208.1 |
| 5,235,333 | 8/1993 | Naylor et al. | 341/118 |
| 5,245,223 | 9/1993 | Lim et al. | 307/362 |
| 5,248,974 | 9/1993 | Fattaruso et al. | 341/172 |
| 5,272,395 | 12/1993 | Vincelette | 307/355 |
| 5,381,148 | 1/1995 | Mueck et al. | 341/139 |
| B1 4,399,426 | 7/1987 | Tan | 340/347 CC |

OTHER PUBLICATIONS

Beresford, R., "A self–calibrating d–a converter," Electronics, Sep. 22, 1981, p. 144.

Bienstman, L. A. et al., "An 8–Channel 8b µP Compatible NMOS Converter with Programmable Ranges," 1980 IEEE International Solid–State Circuits Conference, pp. 16–17.

Bienstman, L. A. et al., "An Eight–Channel 8 Bit Microprocessor Compatible NMOS D/A Converter with Programmable Scaling," IEEE J. Solid–State Circuits, vol. SC–15, No. 6, Dec. 1980, pp. 1051–1058.

Bon, M. et al., "All–Symbolic Analysis Technique for Multiphase Switched Capacitor Networks," pp. 655–660.

Cooperman, M. et al., "Charge Redistribution Codec," J. Solid–State Circuits, vol. SC–16, No. 3, pp. 155–162, Jun. 1981.

Crystal Semiconductor Corporation, "16–Bit, 100 kHz Serial–Output A/D Converter", Preliminary Product Information, DS45PP2, Jan. 1989, pp. B–95–B115.

Dannenberg, R. E., "Closed Loop Digital–to–Analog Conversion," IBM Technical Disclosure Bulletin, vol. 20, No. 6, pp. 2332–2333, Nov. 1977.

De Wit, M. et al., "A Low–Power 12–b Analog–to–Digital Converter with On–Chip Precision Trimming," IEEE J. of Solid–State Circuits, vol. 28, No. 4, Apr. 1993, pp. 455–461.

Dobberstein, E. A., "Auto–Preregulating Coverter with Surge Control," IBM Technical Disclosure Bulletin, vol. 23, No. 8, pp. 3556–3558, Jan. 1981.

Eriksson, S., "Realization of Synchronous Wave Switched–Capacitor Filters," Dept. of Electrical Eng., Linköping University, Linköping, Sweden, pp. 650–654.

Fielder, H. L. et al., "A 5–Bit Building Block for 20 Mhz A/D Converters," IEEE J. Solid–State Circuits, vol. SC–16, No. 3, pp. 1510–155, Jun. 1981.

Fotouhi, B. et al., "An NMOS 12b Monotonic 25µs A/D Converter," 1979 IEEE International Solid–State Circuits Conference, pp. 186–187.

Fotouchi, B. et al., "High–Resolution A/D Conference in MOS/LSI," IEEE J. Solid–State Circuits, vol. SC–14, No. 6, Dec. 1979, pp. 920–926.

Gheewala, T. R., "Parallel, Flux Redistribution D/A and A/D Converters," IBM Technical Disclosure Bulletin, vol. 20, No. 6, pp. 2480–2482, Nov. 1977.

Gillis, M. A. et al., "Supply Tracking Digital–to–Analog Converter," IBM Technical Disclosure Bulletin, vol. 20, No. 11A, Apr. 1978, pp. 4507–4508.

Gregorian, R. et al., "Offset Free High–Resolution D/A Converter," American Microsystems, Inc., Santa Clara, CA, 1980, pp. 316–319.

Gregorian, R., "High–resolution switched–capacitor D/A converter," Microelectronics Journal, vol. 12, No. 2, 1981, pp. 10–13.

Gregorian, R. et al., "An Integrated Single–Chip PCM Voice Codec with Filters," IEEE J. Solid–State Ciruits, vol. SC–16, No. 4, Aug. 1981, pp. 322–333.

Haque et al., "Two Chip PCM Voice Codec with Filters," IEEE J. Solid–State Circuits, vol. SC–14, No. 6, Dec. 1979, pp. 961–969.

Hamade, A. R. et al., "A Single–Chip 8–Bit A/D Converter," IEEE J. Solid–State Circuits, Dec. 1976, vol. SC–11, No. 6, pp. 154–155.

Hampel, D. et al., "Application of Monolithic CMOS Switched–Capacitor Filters and Amplifiers for Signal Processing," IEEE Trans. on Communications, vol. COM–28, No. 10, Oct. 1980, pp. 1828–1831.

Herbst, D. et al., "Master–Slice SC Filters," Lehrstuhl Bauelemente der Elektrotechnik, University of Dortmund, West Germany, pp. 639–643.

Holloway, L., "Elimination of Offset During Analog–to–Digital Conversion," IBM Technical Disclosure Bulletin, vol. 19, No. 9, Feb. 1977, pp. 3610–3611.

Hornak, T. et al., "A High Precision Component–Tolerant A/D Converter," IEEE J. Solid–State Circuits, vol. SC–10, No. 6, Dec. 1975, p. 386.

Iwata, A. et al., "Low Power PCM CODEC and Filter System," IEEE J. Solid–State Circuits, vol. SC–16, No. 2, Apr. 1981, pp. 73–79.

Kleine, U. et al., "Real–Time Programmable Unit–Element SC Filter for LPC Synthesis," Electronics Letters, Aug. 20, 1991, vol. 17, No. 17, pp. 600–602.

Kurth, C. F. et al., "Two–Port Analysis of Cascaded Switched–Capacitor Networks," IEEE 1978.

Kurth, C. F. et al., "Two–Port Analysis of SC Networks with Continuous Input Signals," The Bell System Technical Journal, vol. 59, No. 8, Oct. 1980, pp. 1297–1316.

Lee, H. S. et al., "Self–Calibration Technique for A/D Converters," IEEE Trans. on Circuits and Systems, vol. CAS–30, No. 3, Mar. 1983, pp. 188–190.

Lee, H. S. et al., "A Self–Calibrating 12b 12μs CMOS ADC," 1984 IEEE International Solid–State Circuits Conference, pp. 64–65, 319.

Lee, H. S. et al., "Accuracy Considerations in Self–Calibrating A/D Converters", IEEE Trans. on Circuits and Systems, vol. CAS–32, No. 6, Jun. 1985, pp. 590–597.

Lee, H. S. et al., "A Direct Code Error Calibration Technique for Two–Step Flash A/D Converters," IEEE Trans. Circuits Syst., vol. 36, No. 6, pp. 919–922, Jun. 1989.

Lueder, E. et al., "Equivalent Sampled Data Filter Structures adn Some of Their Properties," IEEE 1978, pp. 752–755.

Maio, K. et al., "An Untrimmed D/A Converter with 14–Bit Resolution," J. Solid–State Circuits, vol. SC–16, No. 6, pp. 616–620, Dec. 1981.

McCreary, J. L. et al., "All–MOS Charge Redistribution Analog–to–Digital Conversion Techniques—Part 1", IEEE J. Solid–State Circuits, SC–10, Dec. 1975, pp. 371–379.

McCreary, J. L. et al., "Precision Capacitor Ratio Measurement Technique for Integrated Circuit Capacitor Arrays," IEEE Trans. on Instruments and Measurement, vol. IM–28, No. 1, Mar. 1979, pp. 11–17.

Pouiojs, R. et al., "A Low Drift Fully Integrated MOSFET Operational Amplifier," IEEE Journal Solid–State Circuits, vol. SC–13, No. 4, Aug. 1978, pp. 499–503.

Pryce, D., "Self–Calibrating A/D Converters, monolithic devices enhance accuracy and linearity," EDN, Jan. 20, 1992, pp. 53–64.

Rosenthal, L. A., "Improved Frequency Meter Circuit," IEEE Trans. on Instrumentation and Measurement, vol. IM–26, No. 4, Dec. 1977, p. 421.

Schulz, R. et al., "Analog–to–Digital Converter with Noise Rejection", IBM Technical Disclosure Bulletin, vol. 15, No. 6, Nov. 1972, pp. 2007–2008.

Schweer, B. et al., "Synthesis and Analysis Programs for VIS–SC Filters," Lehrstuhl Bauelemente der Elektrotechnik, University of Dortmund, West Germany, pp. 644–648.

Suarez, R. E. et al., "All–MOS Charge Redistribution Analog–to–Digital Conversion Techniques—Part II," IEEE J. Solid–State Circuits, vol. SC–10, No. 6, Dec. 1975, pp. 379–385.

Tan, K. S. et al., "A 5V, 16b 10μs Differential CMOS ADC", 1990 IEEE International Solid–State Circuits Conference, pp. 166–167.

Timko, M. P., "Circuit Techniques for Achieving High Speed–High Resolution A/D Conversion," IEEE J. Solid–State Circuits, vol. SC–15, No. 6, Dec. 1980, pp. 1040–1050.

Tröster, G. et al., "Error Cancellation Technique for Capacitor Arrays in A/D and D/A Converters," IEEE Trans. Circuits Syst., vol. 35, No. 6, pp. 749–751, Jun. 1988.

Yamakido, K. et al., "A Single–Chip CMOS Filter/Codec," J. Solid–State Circuits, vol. SC–16, No. 4, Aug. 1981, pp. 302–307.

Yee, Y. S., "Adaptive Reference Voltage Adjustment for an Analog–to–Digital Converter", IBM Technical Disclosure Bulletin, vol. 19, No. 5, Nov. 1976, pp. 2360–2362.

Yee, Y. S. et al., "A Two–Stage Weighted Capacitor Network for D/A–A/D Conversion", IEEE J. Solid–State Circuits, vol. SC–14, No. 4, Aug. 1979, pp. 778–781.

LOW-VOLTAGE CMOS COMPARATOR WITH OFFSET CANCELLATION

FIELD OF THE INVENTION

This invention relates to CMOS comparators and more particularly to CMOS comparators for use in low-voltage, low-power analog-to-digital conversion applications.

BACKGROUND OF THE INVENTION

CMOS semiconductor manufacturing technologies are relatively inexpensive, and permit the design of integrated circuits including both digital and analog functions. CMOS technology has been used to build multi-stage differential amplification circuits for analog-to-digital converters. Such circuits have employed offset memorization to compensate for input offset voltages in the amplification stages.

Offset memorization is generally performed by dividing circuit operation into two phases, an offset memorization phase and an amplification phase. During the offset memorization phase, a capacitor in series with the output of an amplification stage is grounded, allowing the stage's input offset voltage multiplied by the stage's gain to be stored in the capacitor. During the subsequent amplification phase, the memorized offset voltage cancels by subtraction the actual offset voltage of the amplification stage. Alternatively, offsets can be memorized by providing a feedback path around an amplification stage during the offset memorization phase.

Different CMOS differential amplification stages have been proposed for these analog-to-digital conversion applications. These stages have not been particularly well suited to low-voltage operation, however, because too many transistors are connected between the supply rails or because resistors are used to load the outputs of the gain stages.

SUMMARY OF THE INVENTION

In general, the invention features a CMOS comparator which includes a capacitor connected in an electrical path between two amplification stages. The comparator also includes a voltage source, which can provide a common-mode voltage for use in offset memorization, and a switch is provided between the voltage source and an input of the second stage. A variability of an electrical parameter of the voltage source can be matched with a variability of a parameter of the amplification stage. The comparator can also include another switch between another voltage source and an input of a third stage, with the two voltage sources providing different voltages. The two amplification stages can operate using a supply voltage of 5 volts or less, or even 3 volts or less. In addition, the invention can also feature changing the magnitude of a voltage used in a step of memorizing in a certain direction in response to a stimulus which changes the magnitude of an output swing of an amplifying step in the same direction.

In another general aspect, the invention features a comparator gain stage, which includes circuitry for deriving a differential current from two input voltages. Circuitry is also provided for loading the differential current to derive an amplified difference voltage. Further circuitry is provided for bypassing the loading circuitry to reduce a quiescent voltage drop associated with the loading circuitry.

The gain stage of the invention is particularly well suited for low voltage operation because a minimum of number of devices are connected in any series path between the supply rails, and because the load devices are driven with only part of the current from the input differential pair. The gain stage structure of the invention is also advantageous in that its gain is dependent on a ratio defined by the transconductance of matched input and load transistors. Gain is therefore process-independent and insensitive to supply voltage and temperature changes. Clamping is also process-independent and insensitive to changes in supply voltage and temperature, because it is performed by devices which are matched to the devices that they clamp.

In another aspect, the invention is advantageous in that the voltage source devices used in connection with memorizing the offset are matched with the gain stage output devices. This improves responsiveness to drifts and variations and helps to prevent the inputs of gain stages from being driven outside the supply voltages. An offset memorization voltage level can also be different for the different gain stages of the device, which allows for stage-by-stage optimization of the comparator circuitry.

DETAILED DESCRIPTION

Figure 1:
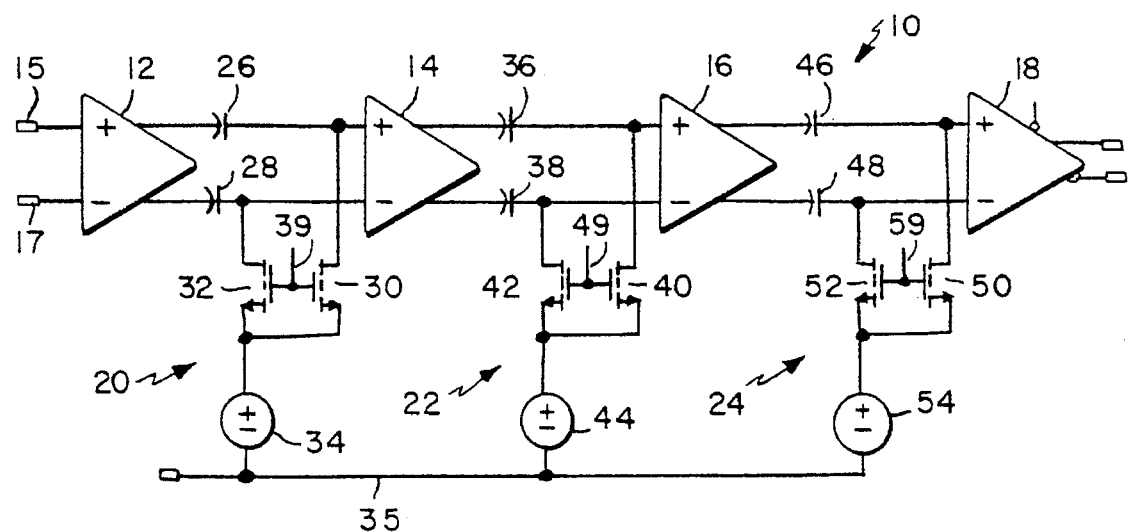
FIG. 1 is a partially-block partially-schematic circuit diagram of an example of a comparator according to the invention.

Referring to FIG. 1, an example of a comparator 10 according to the invention includes a differential input gain stage 12, a first differential intermediate gain stage 14 responsive to the input stage, a second differential gain stage 16 responsive to the first intermediate stage, and a high-speed output latching stage 18 responsive to the second intermediate stage. A first offset memorization circuit 20 is provided between the input gain stage and the first intermediate stage, a second offset memorization circuit 22 is provided between the first and second intermediate stages, and a third offset memorization circuit 24 is provided between the second intermediate stage and the output latching stage. The stage voltage gains are set at 20, 20, and 15 for the input stage and the first and second intermediate stages, respectively. Although this embodiment includes four stages, the principles of the invention are, of course, applicable to circuits with different numbers of stages.

The first offset memorization circuit 20 includes first and second capacitors 26, 28 each located in one of the two signal paths between the input stage 12 and the first intermediate stage 14. A first NMOS reset switch 30 is provided between a first plate of the first capacitor and a first voltage source 34. A second NMOS reset switch 32 is provided between a second plate of the second capacitor and the voltage source 34. The voltage source 34 is referenced to a ground rail 35.

The second offset memorization circuit 22 includes third and fourth capacitors 36, 38 each located in one of the two signal paths between the first and second intermediate stages 14, 16. A third NMOS reset switch 40 is provided between the third capacitor and a second voltage source 44. A fourth NMOS reset switch 42 is provided between the fourth capacitor and the second voltage source. The second voltage source is referenced to the ground rail 35.

The third offset memorization circuit 24 includes fifth and sixth capacitors 46, 48 each located in one of the two signal paths between the first intermediate stage 16 and the output latching stage 18. A fifth NMOS reset switch 50 is provided between the fifth capacitor and a third voltage source 54. A sixth NMOS reset switch 52 is provided between the sixth capacitor and the third voltage source. The third voltage source is referenced to the ground rail 35.

In operation, offset errors due to device mismatches are removed by auto-zeroing each of the input stage 12 and the two intermediate stages 14, 16 in an offset memorization operating state prior to an amplification operating state. This is achieved by shorting inputs 15, 17 of the input stage 12 together, and closing the reset switches 30, 32, 40, 42, 50, 52 in the offset memorization circuits 20, 22, 24. This auto-zeroing also removes other errors introduced by, for example, low-frequency power supply variations, leakage currents, and offset drifts.

The auto-zeroing operation independently sets the common-mode input voltage of each stage 14, 16, and 18 to the value of the respective one of voltage sources 34, 44, and 54. This is an important attribute for a low-voltage system, because the common-mode input level of each stage can be set independently to optimize each stage by assigning different output voltages to the voltage sources 34, 44, and 54. For example, the common-mode voltage at the input to the latching stage might be required to be different (e.g., lower by about 200 mV) from the common-mode voltage at the inputs of the other stages, because its input devices differ from those of the other stages. The ability to set the common-mode voltage of each stage independently obviates the need for level-shifting circuitry.

Another feature of this system is that the NMOS reset switches 30, 32, 40, 42, 50, 52 have their sources biased at a positive voltage. The gates of these devices are driven by the output of a CMOS inverter or buffer (not shown); therefore, when the switches are turned off, the gate-source voltage of these switches is negative. This significantly reduces the sub-threshold leakage current that flows in these switches and, hence, the error such a current would contribute to the operation of the comparator. The use of NMOS reset switches also improves power supply rejection since these switches have their backgates tied to ground 35 and, when turned off, their gates are at ground potential. In the present embodiment, the three voltage sources 34, 44, 54 are each set to approximately 1 V output. Further, the output voltage swing of each gain stage is restricted to less than 1 V by means of clamping devices (not shown), which will be discussed in more detail below in connection with FIG. 4. This choice of source and clamping voltages allows the comparator to be operated without the input nodes of each gain stage going more negative than ground potential.

Setting the common-mode input level to each stage at 1 V also allows each gain stage to use PMOS input devices for its differential pair, as discussed below. Since these devices are isolated in N-wells, they provide good power supply rejection. PMOS devices also have lower threshold voltage (Vt) hysteresis than do NMOS devices. This significantly reduces another potential source of error in the comparator.

Figure 2:
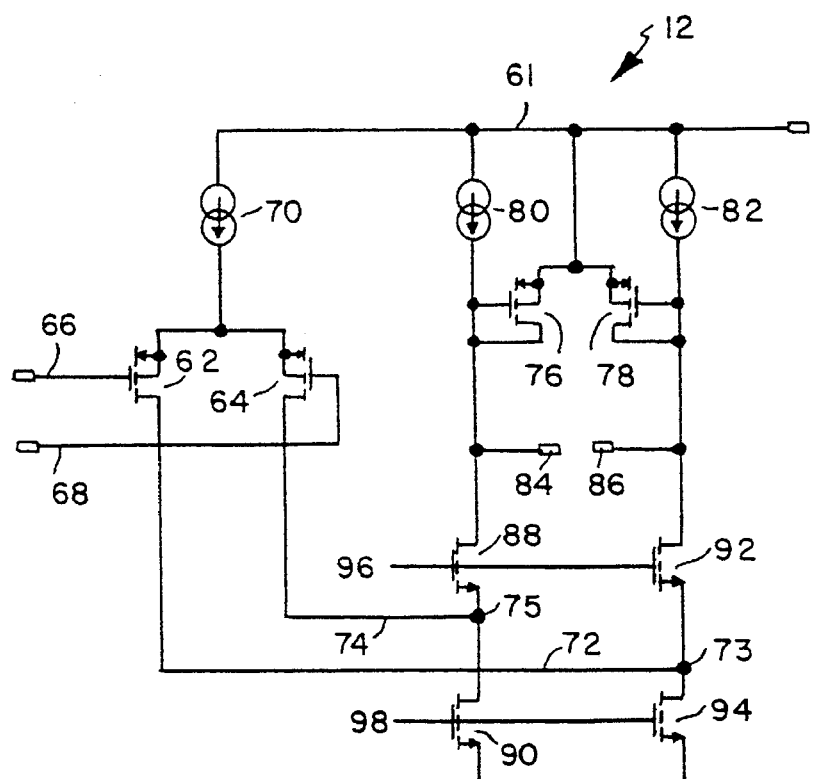
FIG. 2 is a simplified circuit diagram of the first gain stage of the comparator of FIG. 1.

Referring to FIG. 2, the input gain stage 12 includes a folded-cascode gain stage circuit with differential input and differential output. This circuit includes first and second PMOS input devices 62, 64, which form a differential pair. The gates of these devices receive the voltages at the stage's first and second inputs 66, 68, respectively; and the sources of these devices receive current from a first current source 70. The drains of these first and second devices act as the first and second outputs 72, 74 of the differential pair, respectively.

Each gain stage further includes first and second PMOS load devices 76, 78. The sources of these first and second load devices receive the voltage at the positive supply rail 61. The gates and drains of each load device are connected together, and their connected terminals are respectively tied to the outputs of current sources 80, 82 at nodes 84, 86, which nodes also serve as the first and second outputs of the gain stage.

Between the first gain stage output node 84 and a second supply rail 35, which may be at ground potential, is a first NMOS cascode device 88 in series with a first NMOS current source device 90. Similarly, between the stage's second output 86 and ground is a second NMOS cascode device 92 in series with a second NMOS current source device 94. The gates of the cascode devices both receive a first bias voltage 96, and the gates of the current source devices both receive a second bias voltage 98. The first output 72 of the differential pair is provided to a node 73 between the stage's second cascode device 92 and the second current source device 94. The second output 74 of the differential pair is provided to a node 75 between the first cascode device 88 and the first current source device 90.

In operation of the input gain stage 12, the first and second PMOS input devices 62, 64 in the differential pair convert the differential input voltage across the first and second stage inputs 66, 68 to a pair of currents. This signal current pair is then converted back to a voltage by the first and second load devices 76, 78. The first and second bias voltages 96, 98, bias the first and second current source devices 90, 94, and the first and second cascode devices 88, 92 respectively.

The stage gain is set by the ratio of input device 62 or 64 transconductance (gm1) to load device (76 or 78) transconductance (gm2), i.e.:

$$\text{Gain}(A) = \left[ \frac{gm1}{gm2} \right] = \sqrt{\frac{\left(\frac{W1}{L1}\right) \times Ids1}{\left(\frac{W2}{L2}\right) \times Ids2}} \quad \text{(Eq. 1)}$$

where W1 and L1 are the respective widths and lengths of the input devices 62, 64; Ids1 is the drain current in the input devices 62, 64; and Ids2 is the drain current of the load devices 76, 78. Since both the input and load devices are of the same polarity type, i.e., PMOS, and the current ratio can be accurately defined, the gain is set only by the relative sizes of the input and output devices. This makes the gain insensitive (to a first order) to temperature, supply levels and variations, and magnitude of the bias currents. This is particularly important for a low-power design, because the bias currents can be scaled while retaining the same stage gain.

Another important characteristic of a comparator is its noise performance. For the single gain stage as shown above, the total rms thermal noise referred-to-the-input is given by:

$$Vn = \sqrt{\frac{KT}{Cl}} \times \sqrt{\frac{4}{3 \times A}} \times \sqrt{1 + \left(\frac{gm2}{gm1}\right) + \left(\frac{gm3}{gm1}\right) + \left(\frac{gm4}{gm1}\right)} \quad \text{(Eq. 2)}$$

where $C_1$ is the total capacitance on each output node 84, 86;

A is the stage gain as given in Eq. 1;

gm3 is the transconductance of the output current source devices 90, 94; and gm4 is the transconductance of the device forming the second and third current sources 80, 82.

As with the stage gain, the total noise is dependent on transconductance ratios and load capacitance. To a first order approximation, the noise is independent of the bias current level. This again allows the bias current levels to be scaled and still retain the same input noise level or precision.

The use of PMOS input devices 62, 64 also provides an isolated device, because the input devices are situated in an N-well. This results in improved power supply rejection. In addition, a PMOS input device gives low Vt hysteresis, which is another desirable property for a precision comparator.

Due to the differential nature of the gain stage, improved rejection of power supply variation and leakage current errors also results. These types of errors are now dependent on the matching of devices, i.e., the matching of the load PMOS devices 76, 78 with the input PMOS devices 62, 64, and the matching of the second and third current sources 80, 82 with the first and second current source devices 90, 94. In essence, electrical parameters of these devices vary in a matched way in response to variations and drifts. With careful layout techniques, this matching can be quite accurate.

The "Miller" gain, Am, is defined as follows:

$$\text{Miller Gain } (Am) = \left[1 + \frac{go5}{gm2}\right] \times \left(\frac{gm1}{gm5}\right) = \quad \text{(Eq. 3)}$$

$$\left[1 + \frac{go5}{gm2}\right] \times \sqrt{\frac{\left(\frac{W1}{L1}\right) \times Ids1}{\left(\frac{\mu_n}{\mu_p}\right)\left(\frac{W5}{L5}\right) \times Ids5}}$$

where W5 and L5 are the width and length respectively of the cascode devices 88, 92; $\mu_n$ and $\mu_p$ are the mobilities of elections and holes, respectively; Ids1 is the drain current in the input devices 62, 64; Ids5 is the drain current of the output devices 76,78; go5 is the output conductance of the first cascode device 88; and gm5 is its transconductance. In an ac-coupled system, it is desirable to have this gain as low as possible, since the input capacitance of each stage is determined by:

$$Cin = Cgsm1 + [1 + Am] \times Cgdm1 \quad \text{(Eq. 4)}$$

where Cgsm1 is the gate-source capacitance of the input devices 66, 68 and Cgdm1 is the gate-drain capacitance of these devices. The input capacitances (Cin) of the stages are ideally to be reduced as much as possible, because they cause undesirable attenuation between stages. Since the input devices are PMOS and the cascode devices 88, 92 are NMOS, and the NMOS devices have a higher mobility ($\mu$), the Miller gain is low.

Another important feature of each gain stage is its ability to operate from a low supply voltage. The minimum supply voltage Vsupply__min is determined by the following:

$$Vsupply\_min = Vgsm9 + Vdsatm5 + Vdsatm7 \quad \text{(Eq. 5)}$$

where Vgsm9 is the gate-source voltage of the load devices 76, 78; Vdsatm5 is the saturation voltage of the cascode devices 88, 92; and Vdsatm7 is the saturation voltage of the current source devices 90, 94.

Reducing the term "Vgsm9" reduces the supply voltage required. This is achieved by the addition of the second and third current sources 80, 82, which allows current to bypass the load devices 76, 78. These therefore carry a lower current than the input devices 62, 64, and as a result, their quiescent gate-source voltages (Vgs) are reduced.

There are some minor differences in implementation between the stages. In particular, the input gain stage 12 is generally built to be larger than the second two stages 14, 16 and is typically driven by larger currents. This is a matter of scaling, however, and the structure and operation of the first and second intermediate gain stages 14, 16 are in essence the same as for the input gain stage 12. These intermediate stages will therefore not be discussed further.

Figure 3:
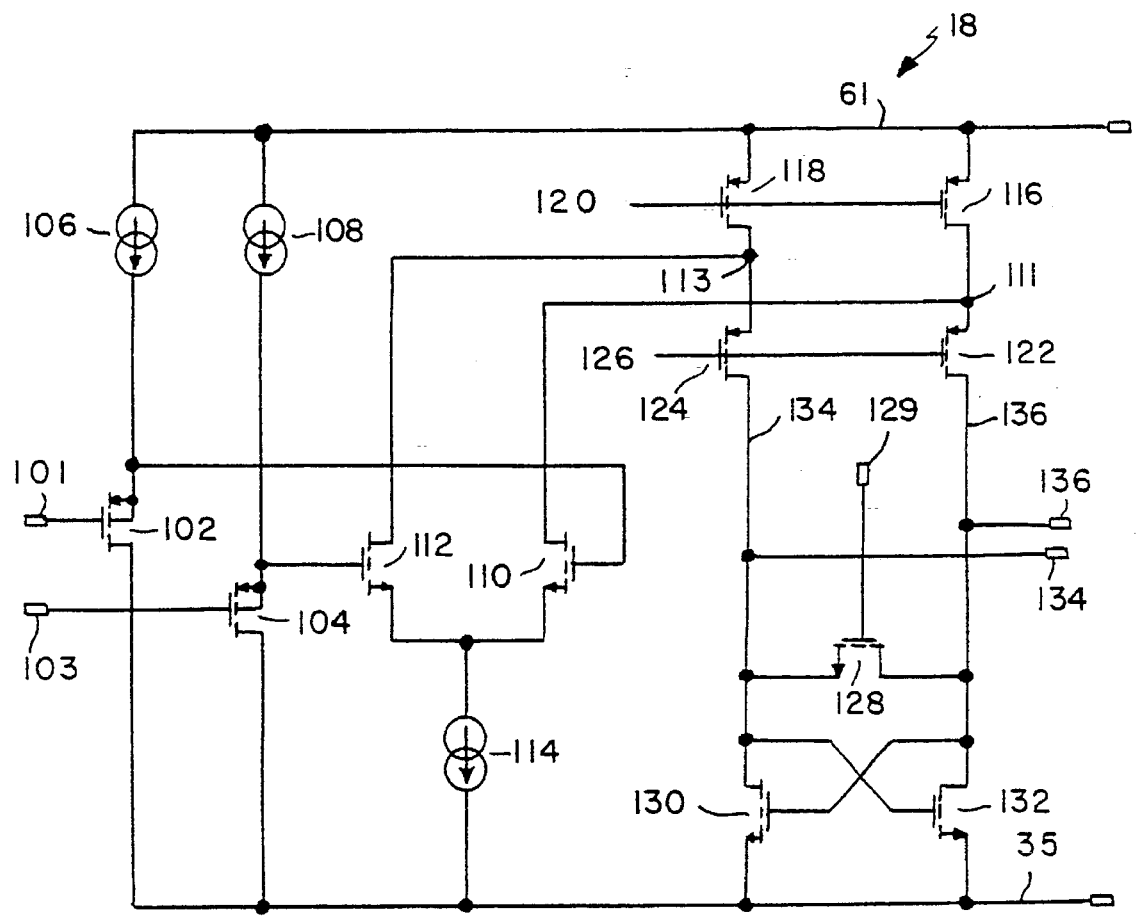
FIG. 3 is a simplified circuit diagram of the latching stage of the comparator of FIG. 1.

Referring to FIG. 3, the output latching stage 18 includes a first PMOS input device 102 with its gate connected to a first input 101 of the stage, and a second PMOS input device 104 with its gate connected to a second input 103 of the stage. The first and second input devices 102, 103 receive current from first and second current sources 106, 108, respectively. The drains of the first and second input devices are connected to the second supply rail 35, and the sources of the first and second input devices are connected respectively to the gates of first and second NMOS differential pair devices 110, 112. The sources of these differential pair devices are connected together and to a third current source 114. The sources of first and second current source PMOS devices 116, 118 receive the supply voltage at the power supply rail 61. The gates of these devices are biased by a first bias voltage 120, and the drains of these devices are respectively connected to first and second PMOS cascode devices 122, 124, which are biased by a second bias voltage 126. The drain of the first differential pair device 110 is connected to a node 111 between the first current source device 116 and the first cascode device 122. The drain of the second differential pair device 112 is connected a node 113 between the second current source device 118 and the second cascode device 124.

An NMOS reset device 128 is provided between the drains of the first and second cascode devices 122, 124. Also provided between these drains are first and second cross-coupled NMOS latching devices 130, 132. These latter devices have their sources connected to the second supply rail 35, and their gates connected to each other's drains.

In operation, the latching stage converts a small signal input voltage at the inputs 101, 103 to a full-CMOS output signal at the outputs 134, 136. The first and second input devices 102, 104 together with the first and second current sources 106, 108 form source follower input stages to reduce kickback from the latching stage. These source followers also level-shift the input signal to drive the differential pair formed by the differential pair devices 110, 112. This input level shifting allows the latching stage to operate at low supply voltages. The NMOS differential pair converts the input signal voltage to a differential current and this differential current drives the cross-coupled latching devices 130, 132.

During the initial part of the comparison operating state, the reset device 128 is "on", which prevents the latching devices 130, 132 from regenerating. When the reset device's gate signal 129 goes low, the reset device 128 is turned off, the latch enters its regeneration mode, and the outputs 134, 136 go to within approximately 50 mV of the power rails 35, 61, respectively. The cross-coupled NMOS latching devices 130, 132 cause this regeneration to occur at very high speed.

Figure 4:
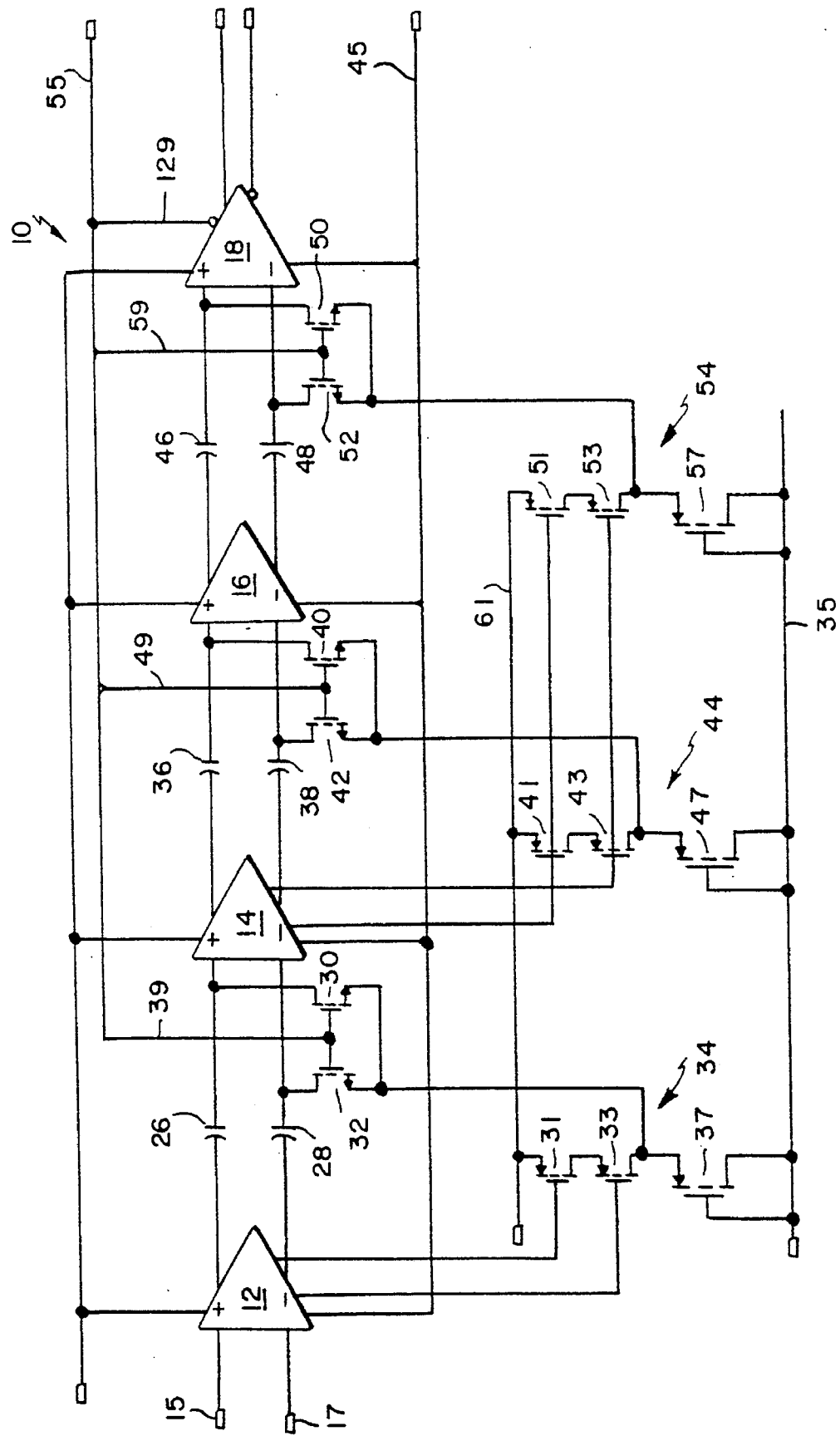
FIG. 4 is a detailed schematic circuit diagram of the comparator of FIG. 1.

Referring to FIGS. 1 and 4, the complete comparator will now be discussed further. The first voltage source 34 includes first and second PMOS current devices 31, 33 together with a first PMOS voltage source device 37. The second voltage source 44 includes third and fourth PMOS current source devices 41, 43, together with a second PMOS voltage source device 47. The third voltage source 54 includes fifth and sixth PMOS current source devices 51, 53, together with a third PMOS voltage source device 57.

Bias voltages and currents are generated from a separate circuit (not shown and within the level of skill in the art to implement) and supplied to the first and second amplification stages 12, 14 via a multiconductor bus 45. Further bias voltages are then derived by circuitry in these stages to bias the gates of the current source devices 31, 33, 41, 43, 51, and 53. First, second, and third reset lines 39, 49, 59 and the latching stage gate signal 129 are driven by a signal supplied via control bus 55, to which they are all connected.

Figure 5:
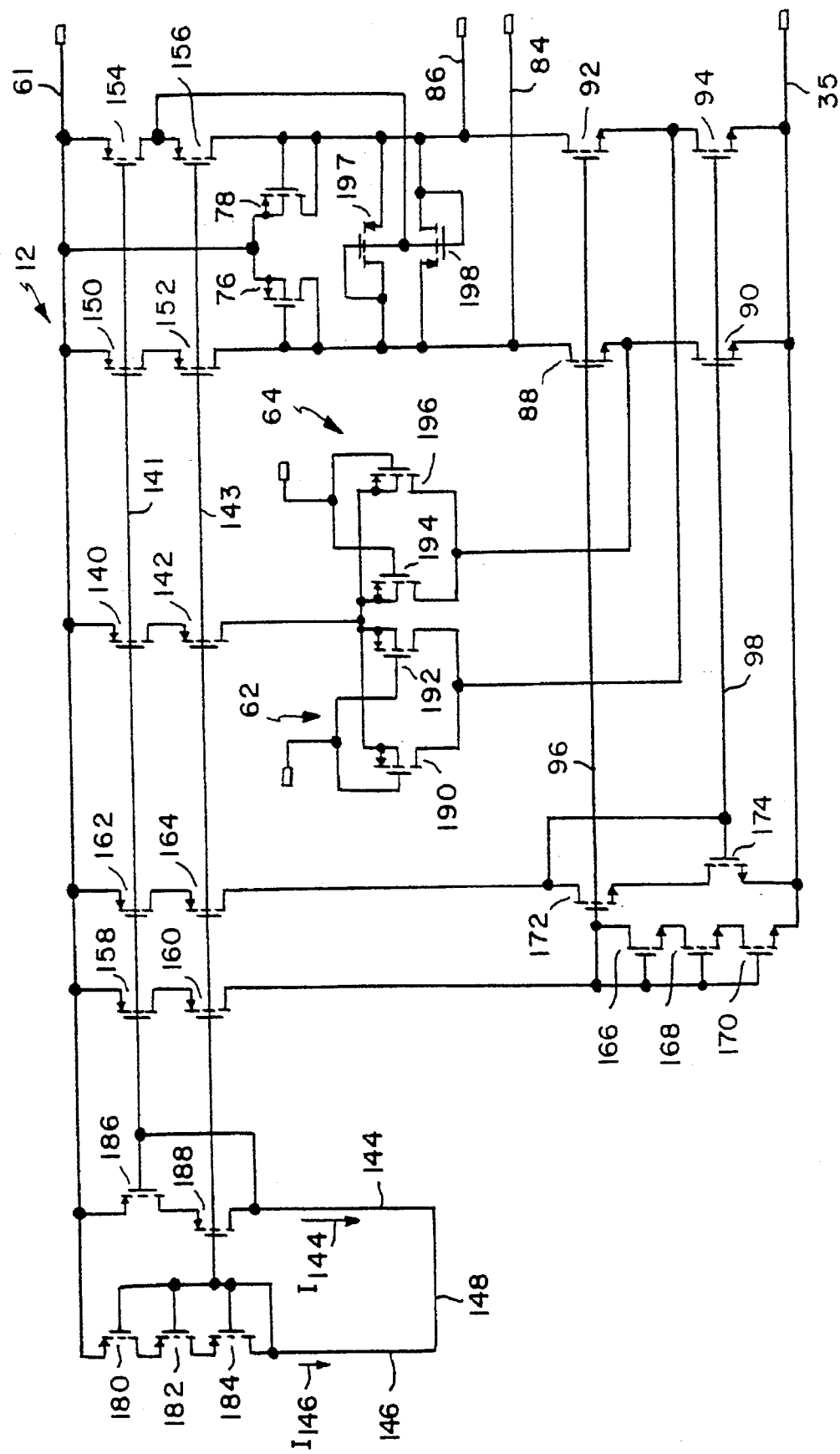
FIG. 5 is a detailed schematic circuit diagram of the gain stage of FIG. 2.

Referring to FIGS. 2 and 5, the input gain stage circuit now will be discussed further. The first current source 70 is implemented with two serially-connected PMOS devices 140, 142, which are biased by reference to first and second separately generated bias currents I144 and I146, respectively, on leads 144, 146 from a bias bus 148.

The second current source 80 is implemented with two more serially-connected PMOS devices 150, 152, which are also biased by reference to the first and second separately generated bias currents I144, I146. The third current source 82 is implemented with two further serially-connected PMOS devices 154, 156, which are also biased with reference to the first and second separately generated bias currents I144, I146. An offset or hysteresis may be introduced to the stage output by making the second and third current sources provide unequal currents. A series of PMOS devices 180, 182, 184, 186, and 188 derive on lines 141, 143 the bias for these three current sources, based on the separately generated bias currents. The first and second bias voltages on lines 96, 98 are generated by four PMOS devices 158, 160, 162, 164 and six NMOS devices 166, 168, 170, 172, 174, 176.

The first and second PMOS input devices 62, 64 are actually formed physically of two devices each. In particular, the first device 62 is made up of first and second parallel-connected PMOS devices 190, 192. Similarly, the second input PMOS device is made up of two parallel-connected PMOS input devices 194, 196.

A pair of PMOS clamping devices 197, 198 is provided across the output of the gain stage circuit. The drain of the first output clamping device is connected to the stage's first output 84 and to the gate of the first output clamping device. The source of the first output clamping device is connected to the stage's second output 86. Similarly, the drain of the second output clamping device 198 is connected to the stage's second output and to the gate of the second output clamping device. The source of the second output clamping device is connected to the stage's first output. These clamping devices are each PMOS devices, and are therefore matched with the PMOS load devices 76, 78 and the PMOS voltage source devices 37, 47, 57 (see FIGS. 1 and 3).

This matching is advantageous in low power operation, as it leads to cancellation of variations due to temperature changes, power supply changes, or processing variations. For example, an increase in the threshold voltage of the load transistors 76, 78 would lead to a larger output swing of the gain stage. This increased swing will be accompanied by an increase in the common mode voltage, because the threshold voltage of the voltage source devices 37, 47, 57 (see FIG. 4) will also be increased. The result is that the increased voltage swing will not cause the output of one stage to go more negative than the second supply line 35.

The clamping PMOS devices restrict the output swing of the stage to approximately ±0.7 V. The addition of these clamping devices reduces the response time of the comparator and allows the common-mode (CM) voltage at each stage input to be set at approximately 1 V. Another advantage of this architecture is that the load devices exhibit an inherent clamping action for negative output transitions because of their square-law behavior.

Figure 6:
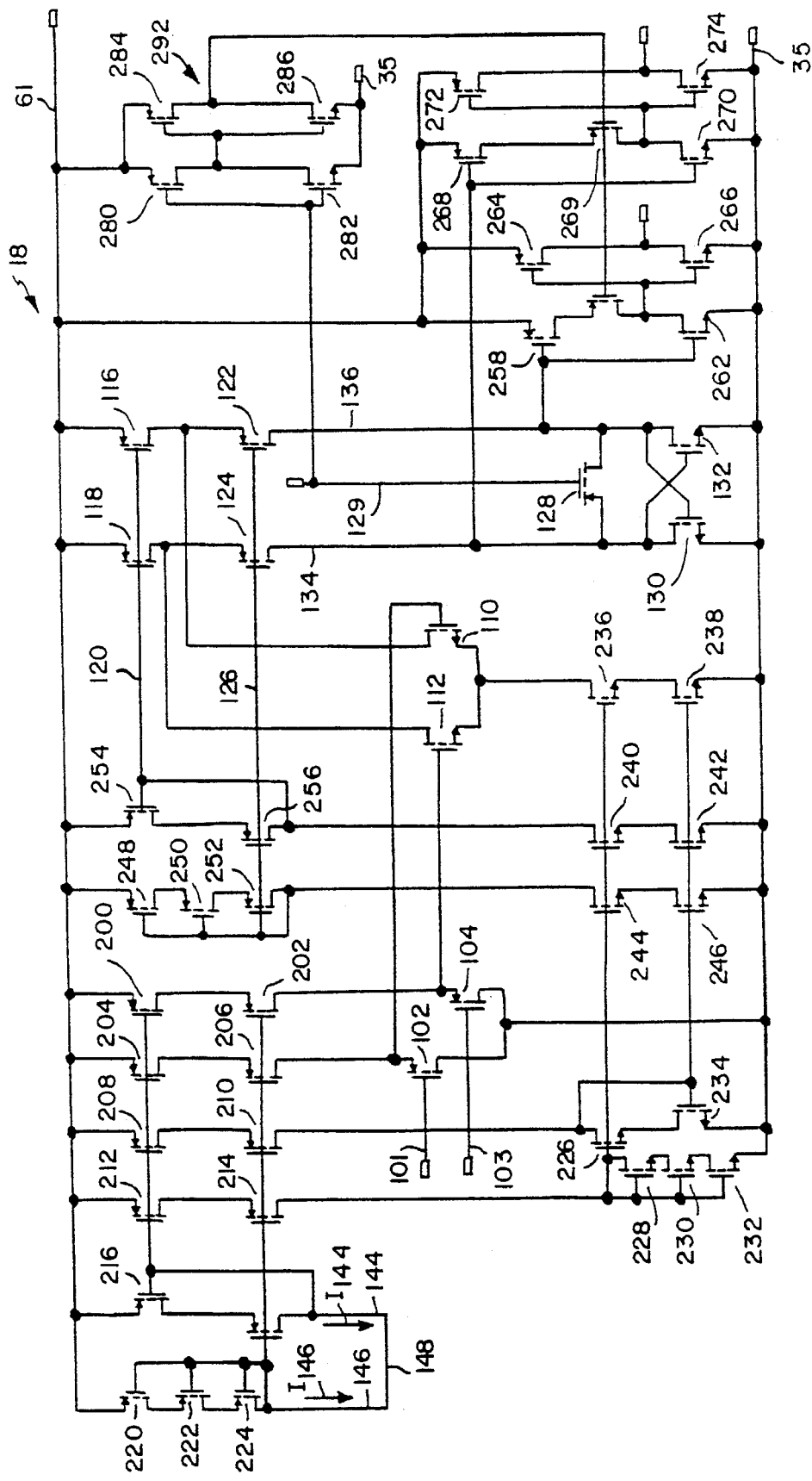
FIG. 6 is a detailed schematic circuit diagram of the latching stage of FIG. 3.

Referring to FIGS. 3 and 6, the latching stage will be further discussed. The first and second current sources 106, 108 are formed by two pairs of PMOS devices 204, 206 and 200, 202, respectively. These current sources also share a series of five more PMOS devices 216, 218, 220, 222, 224, which receive the first and second bias currents I144, I146 provided by way of the bias bus 148.

Two modified CMOS NOR gates 290, 292 are also shown in the detailed schematic. The first NOR gate is made up of a series of PMOS and NMOS devices 258, 260, 262, and is followed by an inverter 264, 266, a second NOR gate 268, 269, 270, and a second inverter 272, 274. Another pair of inverters 292 is provided for delay and is made up of four PMOS and NMOS devices 280, 282, 284, and 286.

The above-described comparator circuitry is particularly useful in connection with a monolithic successive approximation analog-to-digital converter. Further analog and digital circuitry in this analog-to-digital converter interacts with the above-described circuitry in performing analog-to-digital conversion operations. For example, referring to FIG. 4, this circuitry is responsible for generating control signals such as the reset signals 39, 49, 59 and the latching stage gate signal 129 on the control bus. It is also responsible for tying the inputs 15, 17 of the input stage 12 together during an offset memorization phase. An analog-to-digital converter which employs comparator circuitry according to the present invention is discussed in my co-pending application titled "Low-voltage "CMOS Analog-to-Digital Converter", filed on the same day as the present application, and herein incorporated by reference. Also particularly useful in connection with the present application are the calibration methods and circuitry described in a co-pending application entitled "Charge Redistribution Analog-to-Digital Converter with System Calibration", filed on the same day as the present application, and herein incorporated by reference.

While there have been shown and described various embodiments of the present invention, such embodiments are provided by way of example only and it will be obvious to those skilled in the art that various changes and modifications may be made therein without departing from the scope of the invention as defined by the appended claims.

What is claimed is:

1. A CMOS comparator having first and second input nodes and an output node, comprising:

first and second amplification stages, each having a first input node and a second input node, the first input node of the first amplification stage being responsive to the first input node of the CMOS comparator, and the second output node of the first amplification stage being responsive to the second input node of the CMOS comparator, the second amplification stage having an output node, the output node of the CMOS comparator being responsive to the output node of the second amplification stage, a first capacitor coupled in an electrical path between the first output node of the first stage and the first input node of the second stage, a first voltage source, and a first switch coupled in an electrical path between the first voltage source and the first input node of the second stage.

2. The comparator of claim 1 wherein a variability of an electrical parameter of the first voltage source is matched with an a variability of electrical parameter of the first amplification stage.

3. The comparator of claim 2 wherein the first amplification stage comprises an output device of a certain polarity type, and wherein the first voltage source comprises a voltage source device of the same polarity type as the output device.

4. The comparator of claim 3 wherein the output device is a load device.

5. The comparator of claim 3 wherein the output device is a clamping device.

6. The comparator of claim 5 wherein the first amplification stage further includes a load device of the same polarity type as the voltage source device.

7. The comparator of claim 3 wherein both the voltage source device and the output device are PMOS devices.

8. The comparator of claim 1 wherein the first and second amplification stages operate using a supply voltage of 5 volts or less.

9. The comparator of claim 1 wherein the first and second amplification stages operate using a supply voltage of 3 volts or less.

10. The comparator of claim 1 wherein the first and second amplification stages are operable with a single external voltage supply.

11. The comparator of claim 1 wherein the first and second amplification stages are differential stages and each further comprises a second output node, the comparator further comprising:

a further capacitor coupled in an electrical path between the second output node of the first stage and the second input node of the second stage; and a further switch coupled in an electrical path between the first voltage source and the second input node of the second stage.

12. The comparator of claim 1 further including a third amplification stage having a first input node, a second input node, and a first output node, a second capacitor coupled in an electrical path between the first output node of the second stage and the first input node of the third stage, a second voltage source, and a second switch coupled in an electrical path between the second voltage source and the first input node of the third stage.

13. The comparator of claim 12 wherein the first and second voltage sources provide different voltages.

14. The comparator of claim 12 wherein the first, second, and third amplification stages are differential and each comprises a second output node; the comparator further comprising:

a third capacitor connected in an electrical path between the second output node of the first stage and the second input node of the second stage and a fourth capacitor connected in an electrical path between the second output node of the second stage and the second input node of the third stage; further comprising a third switch in an electrical path between the first voltage source and the second input node of the second stage; and further comprising a fourth switch in an electrical path between the second voltage source and the second input node of the third stage.

15. The comparator of claim 14 wherein the first and second voltage sources provide different voltages.

16. The comparator of claim 14 wherein a variability of an electrical parameter of the first voltage source is matched with a variability of an electrical parameter of the first amplification stage, and wherein an a variability of electrical parameter of the second voltage source is matched with an a variability of electrical parameter of the second amplification stage.

17. The comparator of claim 16 wherein the first and second amplification stages each comprise an output device of a certain polarity type, and wherein the first and second voltage sources each comprise a voltage source device of the same polarity type as the output devices.

18. The comparator of claim 17 wherein the output devices are load devices.

19. The comparator of claim 17 wherein the output devices are clamping devices.

20. The comparator of claim 19 wherein the first and second amplification stages each further include a load device operative to provide an output voltage based on a current and having a variability of an electrical parameter matched to the voltage source devices.

21. The comparator of claim 20 wherein the first, second and third amplification stages operate using a supply voltage of 5 volts or less.

22. The comparator of claim 20 wherein the first, second and third amplification stages operate using a supply voltage of 3 volts or less.

23. The comparator of claim 20 wherein the first, second and third amplification stages are operable using a single external voltage supply.

24. The comparator of claim 17 wherein both the voltage source devices and the output devices are PMOS devices.

25. A method of comparing two voltages with amplification circuitry prone to offsets, comprising the steps of:

supplying a power supply voltage to the amplification circuitry, supplying a first common-mode DC voltage by a first DC voltage source, wherein the common-mode DC voltage is different from the power supply voltage, memorizing a first amplification offset, the step of memorizing employing the first DC voltage as a reference, amplifying with the amplification circuitry a difference between the two voltages by a first gain to generate an amplified difference with a first output swing, wherein the step of amplifying is performed in the same integrated circuit as the step of supplying, canceling from the amplified difference the first offset memorized in the step of memorizing, and increasing the magnitude of the first DC voltage in a certain direction in response to a stimulus which increases the magnitude of the first output swing in the amplified difference of the amplifying step about the first common-mode DC voltage in the same direction, the step of increasing the magnitude of the first DC voltage preventing the first output swing from reaching the power supply voltage as a result of matching characteristics of the first DC voltage source and the amplification circuitry.

26. The method of claim 25 wherein the amplifying step includes a loading step that loads the amplified difference from the amplifying step, and wherein the extent of the first output swing is responsive to variations in the loading step.

27. The method of claim 25 wherein the amplifying step includes a clamping step that clamps the amplified difference from the amplifying step, and wherein the extent of the first output swing is responsive to variations in the clamping step.

28. The method of claim 25 further including:

supplying a second common-mode DC voltage by a second DC voltage source, further memorizing a second amplification offset, the step of memorizing employing the second DC voltage as a reference, further amplifying the amplified difference to generate a twice-amplified difference with a second output swing, wherein the step of further amplifying is performed in the same integrated circuit as the step of supplying a second DC voltage, cancelling from the twice-amplified difference the second offset memorized in the further step of memorizing, and changing the magnitude of the second DC voltage in a certain direction in response to a stimulus which changes the magnitude of the second output swing of the further amplifying step in the same direction.

29. The method of claim 25 wherein the amplified difference is a differential signal.

30. A method of comparing two voltages, comprising the steps of:

supplying a first common-mode DC voltage by a first DC voltage source, memorizing a first amplification offset, the step of memorizing employing the first DC voltage as a reference, amplifying by a first gain, a difference between the two voltages to be compared, to generate an amplified difference, wherein the step of amplifying is performed in the same integrated circuit as the step of supplying, cancelling from the amplified difference the first amplification offset memorized in the step of memorizing a first offset, supplying a second common-mode DC voltage by a second DC voltage source, memorizing a second amplification offset, the step of memorizing a second amplification offset employing the second DC voltage as a reference, and wherein the second DC voltage is different from the first DC voltage, amplifying the amplified difference between the two voltages by a second gain in a second amplification step to generate a twice-amplified difference wherein the step of amplifying the amplified difference is performed in the same integrated circuit as the step of supplying a second DC voltage, and cancelling from the twice-amplified difference the second offset memorized in the step of memorizing a second offset.

31. The method of claim 30 further including a respective further memorizing step, amplifying step, and cancelling step applied to results of the step of amplifying the amplified difference and of the step of cancelling from the twice-amplified difference.

32. The method of claim 30 wherein the amplified difference and the twice-amplified difference are differential signals.

33. A CMOS comparator having first and second input means and output means, comprising:

first and second means for amplifying, each having first input means and first output means, the first input means of the first means for amplifying being responsive to the first input means of the CMOS comparator, and the second input means of the first means for amplifying being responsive to the second input means of the CMOS comparator, the second means for amplifying having output means, the output means of the CMOS comparator being responsive to the output means of the second means for amplifying, first means for storing charge coupled in an electrical path between the first output means of the first means for amplifying and the first input means of the second means for amplifying, first means for developing a voltage, and first means for switching in an electrical path between the first means for developing a voltage and the first input means of the second means for amplifying to selectively store an offset in the means for storing charge.

34. The comparator of claim 33 wherein a variability of an electrical parameter of the first means for developing a voltage is matched with a variability of an electrical parameter of the first means for amplifying.

35. The comparator of claim 34 wherein the first means for amplifying comprises a loading device means of a certain polarity type, and wherein the first voltage source comprises a voltage source device means of the same polarity type as the loading device means.

36. The comparator of claim 34 wherein the first means for amplifying comprises a clamping device means of a certain polarity type, and wherein the first voltage source comprises a voltage source device means of the same polarity type as the clamping device means.

37. The comparator of claim 33 wherein the first and second means for amplifying operate using a supply voltage of 5 volts or less.

38. The comparator of claim 33 wherein the first and second means for amplifying operate using a supply voltage of 3 volts or less.

39. The comparator of claim 33 wherein the first and second means for amplifying are operative using a single external voltage supply.

40. The comparator of claim 33 wherein the first and second means for amplifying are differential means for amplifying and each comprises a second output means, the comparator further comprising:

further means for storing charge coupled in an electrical path between the second output means of the first means for amplifying and the second input means of the second means for amplifying; and further means for switching coupled in an electrical path between the first means for developing a voltage and the second input means of the second means for amplifying.

41. The comparator of claim 33 further including a third means for amplifying having first input means, second input means, and first output means, second means for storing charge coupled in an electrical path between the first output means of the second means for amplifying and the first input means of the third means for amplifying, second means for developing a voltage, and second means for switching coupled in an electrical path between the second means for developing a voltage and the first input means of the third means for amplifying.

42. The comparator of claim 41 wherein the first and second means for developing a voltage are for providing different voltages.

43. A CMOS comparator for comparing two voltages, comprising:

means for supplying a power supply voltage, means for supplying a first DC voltage implemented in an integrated circuit, means for memorizing a first amplification offset, the means for memorizing employing the first DC voltage as a reference, means for amplifying a difference between the two voltages by a first gain to generate an amplified difference with a first output swing, the means for memorizing being responsive to the means for amplifying, the means for amplifying being implemented in the integrated circuit, the means for amplifying being responsive to the means for supplying a power supply voltage, means responsive to the means for amplifying for canceling from the amplified difference the first offset memorized by the means for memorizing, and wherein the means for supplying a first DC voltage is operative to increase the magnitude of the first DC voltage in a certain direction in response to a stimulus which increases the magnitude of the first output swing of the means for amplifying in the same direction, the means for supplying a first DC voltage preventing the first output swing from reaching the power supply voltage as a result of matching characteristics of the means for supplying a first DC voltage and the means for amplifying.

44. The comparator of claim 43 wherein the means for amplifying includes a loading means, and wherein the extent of the first output swing is responsive to variations in the loading means.

45. The comparator of claim 43 wherein the means for amplifying includes a clamping means, and wherein the extent of the first output swing is responsive to variations in the clamping means.

46. The comparator of claim 43 further including a plurality of successive respective further memorizing, amplifying, and cancelling means responsive to the means for amplifying.

47. The comparator of claim 43 wherein the amplifying means generates the amplified difference as a differential signal.

48. The comparator of claim 43 wherein the means for memorizing, amplifying, and cancelling are powered using only a supply voltage of 5 volts or less.

49. The comparator of claim 43 wherein the means for memorizing, amplifying, and cancelling are powered using only a supply voltage of 3 volts or less.

50. A CMOS comparator for comparing two voltages, comprising:

means for supplying a first DC voltage implemented in an integrated circuit, means for memorizing a first amplification offset, the means for memorizing employing the first DC voltage as a reference, means for amplifying a difference between the two voltages to be compared by a first gain to generate an amplified difference, the means for memorizing being responsive to the means for amplifying, the means for amplifying being implemented in the integrated circuit, means responsive to the means for amplifying for cancelling from the amplified difference the first offset memorized by the means for memorizing a first amplification offset, means for supplying a second DC voltage implemented in the integrated circuit, means for memorizing a second amplification offset, the means for memorizing a first offset employing the second DC voltage source as a reference, which second DC voltage is different from the first DC voltage, means for amplifying the amplified difference between the two voltages by a second gain to generate a twice-amplified difference the means for memorizing a second offset being responsive to the means for amplifying the twice-amplified difference, the means for amplifying the amplified difference being implemented in the integrated circuit, and means responsive to the means for amplifying the twice-amplified difference, for cancelling from the twice-amplified difference the second offset memorized by the means for memorizing a second offset.

51. The comparator of claim 50 further including respective further means for memorizing, amplifying, and cancelling.

52. The comparator of claim 50 wherein the means for amplifying generates the amplified difference as a differential signal and wherein the means for amplifying the amplified difference generates the twice-amplified difference as a differential signal.

53. The comparator of claim 50 wherein the means for memorizing, amplifying, and cancelling are powered using only a supply voltage of 5 volts or less.

54. The comparator of claim 50 wherein the means for memorizing, amplifying, and cancelling are powered using only a supply voltage of 3 volts or less.

* * * * *